US009547735B2

(12) United States Patent
Nayak et al.

(10) Patent No.: US 9,547,735 B2
(45) Date of Patent: Jan. 17, 2017

(54) SYSTEM AND METHOD FOR VIEWING AND MODIFYING CONFIGURABLE RTL MODULES

(71) Applicant: Synopsys, Inc., Mountain View, CA (US)

(72) Inventors: Anshuman Nayak, San Jose, CA (US); Samantak Chakrabarti, Kolkata (IN); Nilam Sachan, Noida (IN); Nitin Bhardwaj, Delhi (IN); Brijesh Agrawal, Greater Noida (IN); Nishant Sharma, Delhi (IN)

(73) Assignee: Synopsys, Inc., Mountain View ( * ) Notice: Subject to any disclaimer, the term of this patent is extended or adjusted under 35 U.S.C. 154(b) by 0 days.

(21) Appl. No.: 14/745,675

(22) Filed: Jun. 22, 2015

(65) Prior Publication Data

US 2015/0379176 A1 Dec. 31, 2015

Related U.S. Application Data

(60) Provisional application No. 62/019,360, filed on Jun. 30, 2014.

(51) Int. Cl.
*G06F 17/50* (2006.01)
(52) U.S. Cl.
CPC .................... *G06F 17/5045* (2013.01)
(58) Field of Classification Search
CPC G06F 17/5022; G06F 17/5045; G06F 17/505; G06F 17/5054; G06F 17/5068; G06F 17/5081; G06F 2217/04; G06F 2217/68; G06F 17/5027; G06F 2217/86; G06F 17/504; G06F 12/0607; G06F 15/17375; G06F 8/35; G06F 11/261; G06F 8/34; G06F 11/3664; G06F 17/2241; G06F 17/2264; G06F 8/10; G06F 8/73; G06F 11/3688; G06F 11/3696; G06F 8/355; G06F 11/3604
USPC .................................................. 716/100–106
See application file for complete search history.

(56) References Cited

U.S. PATENT DOCUMENTS

| 5,500,800 | A | 3/1996 | Talbott | |
|---|---|---|---|---|
| 7,475,000 | B2 | 1/2009 | Cook et al. | |
| 8,103,987 | B2 | 1/2012 | Banerjee et al. | |
| 8,656,335 | B2 | 2/2014 | Nayak et al. | |
| 2004/0025122 | A1* | 2/2004 | Schubert | G06F 17/504 716/106 |
| 2007/0186205 | A1* | 8/2007 | Yu | G06F 17/505 716/102 |

(Continued)

OTHER PUBLICATIONS

Printout: http://www.edautil.com/Baya.html, Baya SoC Integration Platform, Corporate presentation published May 2013, 20 pgs.

*Primary Examiner* — Binh Tat
(74) *Attorney, Agent, or Firm* — Fenwick & West LLP

(57) ABSTRACT

A configurable module editor and viewer (CMVE) reads the RTL description of a configurable module keeping track of all possible configuration options. Configuration options include pre-processor macros that are normally removed by RTL parsers. The CMVE allows users to view multiple configurations simultaneously. The CMVE assists users in editing the configurable module by presenting a simplified view of interest, while automatically propagating changes and maintaining consistency in the configurable module. The CMVE outputs updated RTL that maintains all configuration options.

19 Claims, 3 Drawing Sheets

(56) References Cited

U.S. PATENT DOCUMENTS

2011/0145781 A1\* 6/2011 Chen .................. G06F 17/5054
716/137

\* cited by examiner

SYSTEM AND METHOD FOR VIEWING AND MODIFYING CONFIGURABLE RTL MODULES

CROSS-REFERENCE TO RELATED APPLICATION

This application claims priority under 35 U.S.C. 119(e) from U.S. provisional application No. 62/019,360; filed Jun. 30, 2014.

TECHNICAL FIELD

This invention relates to the field of integrated circuits design and in particular to the modification of configurable design modules. More particularly the invention relates to a system, method and computer program product for reading a configurable design, and allowing users to view and edit the configurable design.

BACKGROUND ART

Electronic chip designers develop chips of ever increasing complexity using more and more transistors. Complex chips are often called a Systems-on-a-chip (SOC). SOC designers frequently simplify the development task by incorporating intellectual property (IP) modules into their design. IP modules implement pre-defined functions, are often developed by third parties and have usually been successfully used in multiple, earlier designs.

IP module developers make their modules configurable so that the module can be used in as many designs as possible. Configuration options affect the functionality of the module and how it is implemented. IP modules are usually written in RTL design languages such Verilog and VHDL. The SOC designer can customize an IP module by defining parameter values and specifying macro keyword values. Different members of the SOC development team may use different configuration options. Team members who emulate the design using FPGAs may use configuration options that allow the design to be implemented on an FPGA. Team members concerned with speed, timing and power may use different configuration options.

For many designs the SOC designer has to make significant modifications to IP modules. IP modules typically use generic memories and have few or no options for limiting power use. The SOC designer may replace all generic memories defined in the IP module with memory modules customized for the target process. The SOC designer may wish to replace time-critical or power-inefficient RTL constructs. The SOC designer wants to preserve the configurability of the IP module as he or she modifies it. Modifying these configurable IP modules is often a difficult, error-prone and time-consuming task. Each modification needs to work with all possible configurations. The problem is often compounded because the IP module developers are typically improving their IP modules and supplying periodic updates. If the SOC designer wants to use the latest version of an IP module, he or she will have re-make all of his or her changes.

Existing design tools treat RTL macros as pre-processing directives. They simplify the RTL by propagating macro values and effectively remove all reference to the macros.

SOC designers need an electronic design tool to help them modify configurable modules and SOC designs.

SUMMARY DISCLOSURE

A method for the viewing and editing of configurable modules of an integrated circuit design is, provided, which is implemented as a configurable module viewer and editor (CMVE) software tool run on a programmed computing system. The system includes a computer processor having access to memory storing the software tool, a computer display for visual representation of configurable modules in an integrated circuit design in their multiple possible configurations, and an input device for receiving user inputs of changes to the circuit design. The method, when the software tool is run on the computing system, begins by receiving and storing, in the memory, a register-transfer-level (RTL) description of at least a specified portion of an integrated circuit, the received RTL description specifying at least one configurable module of the integrated circuit. The received RTL description may contain, for at least one configurable module, any one or more of: ifdef/undef statements; define statements; parameter definitions; pragmas; generate statements (ifgenerate, forgenerate); and macro usage. Configuration options specified in the RTL description may include pre-processor macros that are normally removed by RTL parsers.

The processor constructs, and stores in the memory, a database that incorporates for each configurable module all configuration options specified in the RTL description Constructing this database of configuration options may comprise extracting the configurability of modules defined in the RTL description by considering all configurability aspects defined by any one or more of 'define, 'ifdef, generate-if, generate-for, and generate-case statements. Constructing the database may also consider configurability aspects across 'include files inside another file. It may also model configurability on any partial constructs in the RTL description.

The computer display presents a visual representation of a specified portion including at least one configurable module in the integrated circuit such that, based on the stored database, multiple configuration options of the module are viewable simultaneously. Displaying a visual representation of at least one configurable module may simultaneously shows all possible configurations of a module, or alternatively may present a simplified view of one or more possible configurations for a module that a user selects to view at the same time. Different ones of the possible configurations may be displayed in a visually distinctive manner, including one or more of component naming and color.

One or more changes to the RTL description are received as user input from the input device. The user input on one or more changes to the RTL description may be received in the form of graphical commands, or in the form of scripts and stored macros. It may include design modifications that group, ungroup or move across hierarchies components, as well as design modifications where one or more IP instances are replaced and those where any RTL statements that will likely generate time-critical paths are replaced with fast library components.

The processor using the constructed database automatically propagates the received changes through the RTL description in a manner that maintains consistency of the configurable module in all configuration options, such that an updated RTL description, with corresponding updates to the database, are stored in the memory. Automatically propagating changes through the RTL description preserves configurability of modules as logic is moved around or modified by the received user input. Configurability on ports, parameters and connections created from moving blocks across hierarchies in the RTL description are automatically propagated by the processor through the RTL description. Preferably, automatically propagating changes through the RTL description makes minimal modifications such that only configurability of impacted and modified areas of the RTL description are changed and such that a difference utility will be able to identify what has been modified by comparison with the received RTL description.

DETAILED DESCRIPTION

Reference Terms & Acronyms

Figure 1:
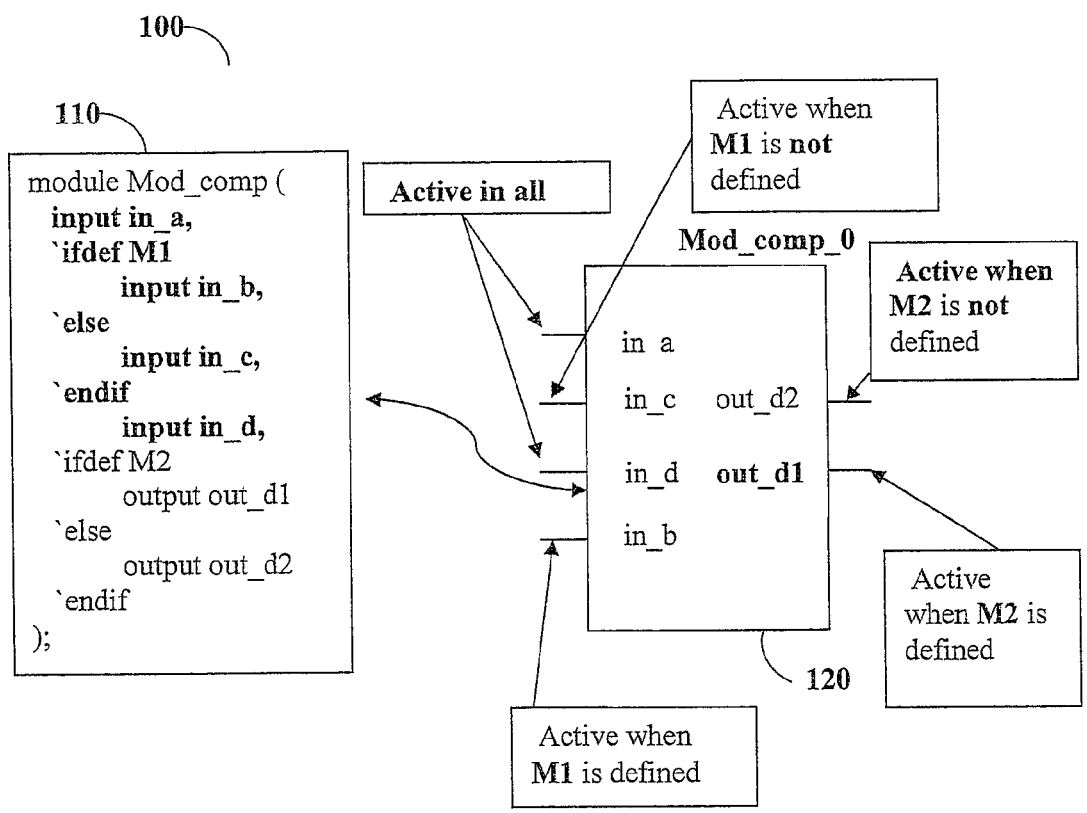
FIG. 1 shows a sample RTL module and gives a corresponding visual interpretation.

Configurable Module Viewer & Editor (CMVE): A system that reads a configurable RTL module, produces a configurable-RTL database and allows users to view and edit different design configurations.

Configurable-RTL Module: An RTL module that contains configuration options such as 'ifdef, 'undef, 'define, parameter setting, pragmas, macros, ifgenerate and forgenerate statements.

Configurable-RTL Database: A database that includes all possible RTL objects from all possible configurations. The RTL objects are tagged according to their configuration membership.

Design configuration: A specific set of objects generated under a specific set of macro states.

Macro States: A macro can have defined or undefined state. A macro has defined state when specified in a "define" statement and undefined state otherwise or when referenced in an "undef" statement. Macro states are referenced in "ifdef" statements.

Macro Combination: A macro combination is a unique combination of individual macro states. For example line N of the RTL may be enabled when "M1 & !M2" is true, where M1 and M2 are macro names.

A configurable module editor and viewer (CMVE) reads the RTL description of a configurable module keeping track of all possible configuration options. Configuration options include pre-processor macros that are normally removed by RTL parsers. The CMVE creates a Configurable RTL Database that contains all possible objects tagged with their macro dependencies. The CMVE allows users to view multiple configurations simultaneously. The CMVE assists users in editing the configurable module by presenting a simplified view of interest, while automatically propagating changes and maintaining consistency in the configurable design. The CMVE outputs updated RTL that maintains all configuration options.

IP module developers use the following options to write scalable and configurable code:

1. 'defines: Defines are used to control the parameter values at the global level as well as for enabling various portions of RTL at the compile time.

2. 'ifdef/'undef: This allows the designer to generate different designs from the same RTL file. A single module can be compiled in low-power mode or in compact area mode by enabling/disabling global defines.

3. Parameters: Parameters are used to make the design more scalable. Changing the value of a parameter allows a designer to reuse the same component in different situations.

4. Pragmas: Pragma are typically used to guard simulation specific code, but designers have started using them in non-conventional ways to get around the limitation/capability of the RTL language.

5. Generate statements: Generate statements such as "generate-if" and "generate-for" indicate conditional instantiation of components.

The RTL "generate" statement provide a way of specifying multiple instances of the same sub-component, connected in some regular pattern. RTL "generate" statements typically contain "for" statements for repeated instantiation, "if" statement for conditional instantiation and other controlling statements such as "case". For example, the following Verilog code generates 8 buffer instances:

```
genvar index;
generate
for (index=0; index < 8; index=index+1)
    begin: gen_code_label
        BUFR BUFR_inst (
            .O(clk_o(index)), // Clock buffer output
            .CE(ce), // Clock enable input
            .CLR(clear), // Clock buffer reset input
            .I(clk_i(index)) // Clock buffer input
        );
    end
endgenerate
```

FIG. 1 is an exemplary diagram 100 showing an RTL module definition 110 and a visual representation of that module 120. The RTL module definition 110 defines a module called Mod_comp. The RTL module definition 110 defines four possible inputs to the module: input_a, input_b, input_c, and input_d. Only three of these inputs will be present in the component implementation. If the macro M1 is enabled the inputs will be input_a, input_b and input_d, otherwise the inputs will be input_a, input_c, and input_d. The 'ifdef M1 statement controls whether input_b or input_c will be implemented. Similarly the 'ifdef M2 statement controls whether out_d1 or out_d2 will be implemented as output. The visual representation 120 shows an instance of the module Mod_comp with instance name Mod_comp_0. The visual representation 120 shows all possible inputs and outputs of the module instance.

In one example, the RTL designer decides to view the design with macro M1 enabled and macro M2 disabled. The RTL designer replaces the module Mod_comp with a new module New_comp and asks the CMVE to save the design changes. The CMVE writes out new RTL as follows:

```
`ifdef M1&!M2
module New_comp(
    input in_a,
    input in_b,
    input in_d,
    output out_d2
);
`else
module Mod_comp (
    input in_a,
    `ifdef M1
        input in_b,
    `else
        input in_c,
    `endif
    input in_d,
```

```
`ifdef M2
    output out_d1
`else
    output out_d2
`endif
);
`endif
```

This allows the RTL designer to make a simple change to the design under conditions of interest. The CMVE automatically handles the complexity of defining what happens under other conditions.

Figure 2:
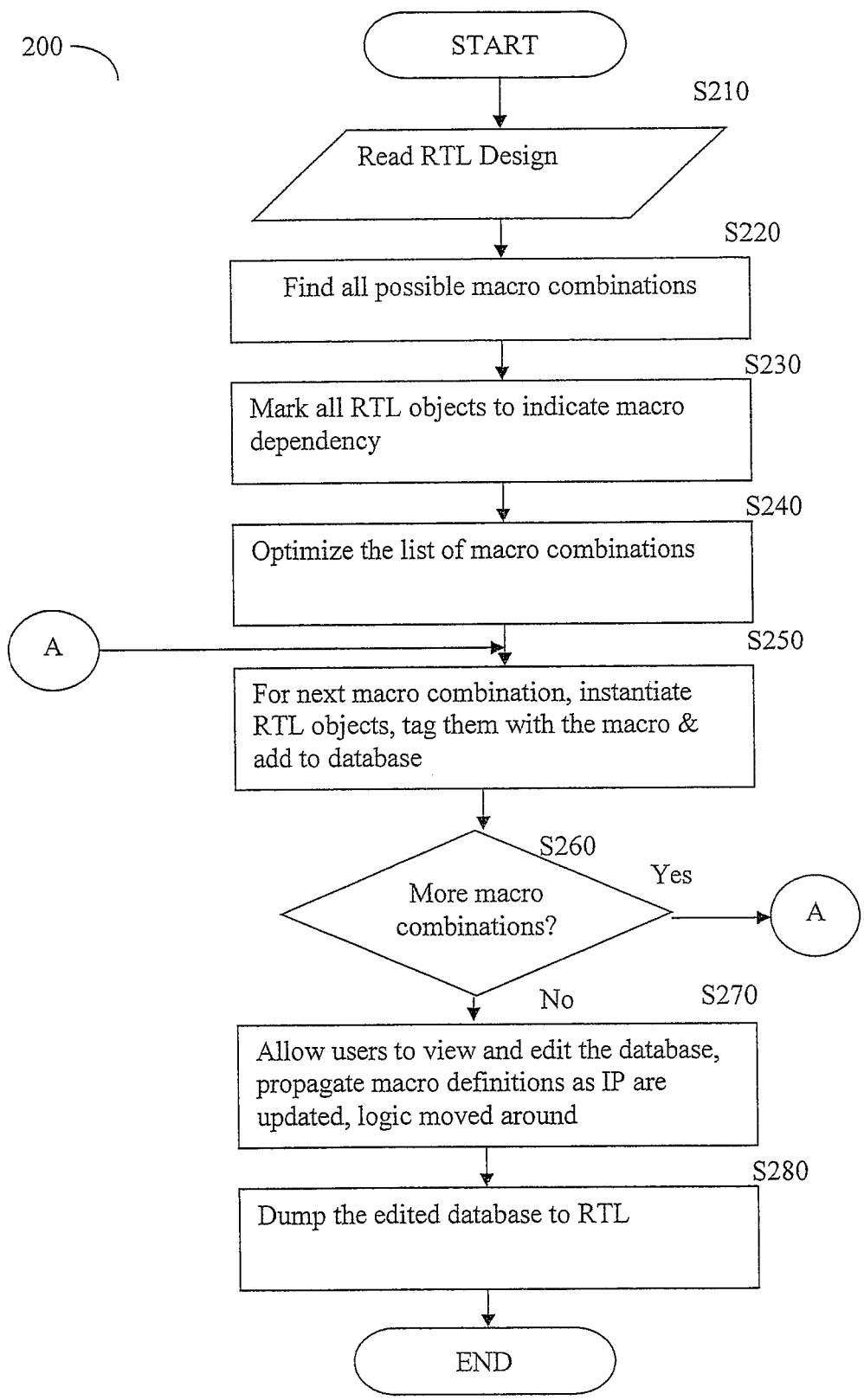
FIG. 2 shows a flowchart outlining steps for reading a configurable module, allowing a user to view and specify changes to the module and for automatically updating the RTL.

FIG. 2 is an exemplary and non-limiting flowchart 200 for reading a configurable module, allowing a user to view the configurable module and allowing a user to edit the configurable module. In S210 the CMVE reads the RTL design file or files that define a configurable module. The CMVE makes note of all non-macro configuration options such as pragmas and parameter definitions. In S220 the CMVE determines all macro combinations. The CMVE identifies all macro keywords referenced in 'ifdef statements. The CMVE recognizes boolean combinations of macro keywords e.g., 'ifdef M1&!M2 uses macro-combination M1&!M2. The CMVE recognizes nested 'ifdef statements and flattens them by ANDing the outer macro expression with the inner macro expression.

The CMVE has to capture the whole intent of the design irrespective of the areas which will become active under different macro combinations. The CMVE does a text based parsing of the RTL input. While parsing the RTL files the CMVE maintains a stack that keeps track of macro applicability. This stack increases and decreases in size as the CMVE encounters 'ifdef and 'endif statements. To find out the macro applicability for a specific RTL object, the CMVE does the ANDING of contents of the stack from bottom to top. For example, if the contents of the stack are M1, M2, and M3 where M3 is the top of the stack, then the applicable macro condition would be M1&M2&M3. Else branches of the Macros are represent by 'else or 'ifndef in the RTL and the CMVE captures them in the stack using the NOT(!) operator. For example the "else" branch of 'ifndef M1 would be captured as !M1. It is possible to have RTL files included in other RTL files. The CMVE traverses through all the include files and ensures that the current state of the stack is extended to note the include file under consideration.

In S230 the CMVE marks each RTL object with its macro dependency. The CMVE does this by generating a data structure that associates a boolean, macro expression with each RTL object. In S240 the CMVE optimizes its list of macro combinations by removing duplicates and unused combinations.

The CMVE allows a user to specify macros to be ignored. The user may not want to maintain configurability in terms of those macros. Ignoring macros will make the CMVE faster by reducing the number of macro combinations.

The CMVE further optimizes the macro-combinations generated by the parser in S220 as follows:
1) Macro-combinations which cannot be valid are removed. For example, the macro X can be defined in the RTL and in CMVE run-time parameters (e.g., on the CMVE command line). The macro-combination !X&Y cannot be valid if X is defined.
2) Macro-combinations depending on undefined macros e.g., (!X&!Y or !Z) and (!A&!B) are combined into one macro-combination where all macros are undefined, e.g., (!A&!B&!X&!Y&!Z).
3) Macro-combinations having macros to be ignored are removed.

Many RTL designs contain syntactic errors in unused or rarely-used macro-combinations. The CMVE reports those macro-combinations which result into syntax errors and continues to process macro-combinations with valid syntax. If the CMVE discovers a syntax error in the case where all macros are undefined it tries successive macro-combinations until it finds a macro-combination without syntax errors. After finding a successful macro-combination, the CMVE attempts to merge the remaining macro-combination.

The complete SOC RTL can have hundreds of unique macro combinations. The CMVE maintains a database containing RTL objects for every macro-combination. This database is large for a complete large-scale SOC design. The user can process a sub-set of the complete SOC design to limit the size of the CMVE database. For example, the user may want to treat the top level design and only a few specific sub-systems. The user specifies the full RTL design of the sub-systems of interest and specifies the interface definition for the other sub-systems. The CMVE ensures that unique macro combinations which are only part of the interface-only sub-systems are not considered for merging.

The CMVE has an option where it can ignore unique global macro combinations. A global macro combination is a macro combination present in the global scope, which is outside a module boundary.

In S250 the CMVE starts to loop over the possible macro combinations. On the first iteration at S250 the CMVE identifies the first macro combination. On subsequent iterations the CMVE identifies the next macro combination. In S250 the CMVE instantiates the RTL objects associated with the identified macro combination. The CMVE adds the RTL objects to a database and tags them with the identified macro combination. In 5260 the CMVE checks if there are more macro combinations. If the CMVE finds more macro combinations it loops back to S250. If the CMVE does not find more macro combinations it proceeds to S270.

It is possible for an RTL object to be active under more than one macro combination, and also the properties of the same object can differ in different macro combinations. When an object is visible under only one macro combination the CMVE tags it with that particular macro combination. If an object is visible in more than one macro combination the CMVE tags it with properties for each of the different macro combinations. The following Verilog example illustrates this:

```
module uart (
`ifdef FPGA
    input [3:0] interrupt;
`else
    input [7:0] interrupt;
`endif
);
```

In the above example, the IP module called uart has a port called interrupt with different width based on whether this is to be implemented with the FPGA macro defined or not defined. The CMVE finds these kind of objects and calls them partial constructs. This is in contrast to the scenario where an entire RTL construct (e.g., an entire port or user instance) is conditionally instantiated.

In S270 the CMVE displays the configurable module in a schematic form. The CMVE displays all possible configurations and highlights those components, pins and nets that are macro dependent. In one embodiment the CMVE displays macro dependent module instances, pins, parameters and nets in different colors. In another embodiment the CMVE adds identifying text to the component, pin or net name e.g., comp_1 (M1&!M2). The CMVE allows users to select alternate views that correspond to different macro combinations. For example, the user can request a view corresponding the macro expression M1&!M2. The CMVE allows users to modify the configurable module. The CMVE provides the usual schematic editing capabilities of adding, moving & deleting components, pins and nets. In addition to the usual editing capabilities the CMVE keeps track of the macro dependencies of added components. The CMVE allows users to group and ungroup components. Grouping components introduces a new hierarchical level. For example, a user may replace a generic memory component with multiple technology-specific memory modules and then group the multiple technology-specific memory modules into a new module. The CMVE allows users to move logic blocks from one hierarchy level to another. The CMVE keeps track of all possible configurations and reports inconsistencies in any configuration. Inconsistencies include unconnected pins and dangling nets.

The CMVE allows script-language editing of its database using languages such as the Tool Command Language (TCL). The CMVE provides script language commands that implement all of the schematic editing capabilities. The CMVE allows users to execute script commands. The CMVE allows users to record schematic editing commands as script commands. Users can use script commands to simplify repetitive commands. SOC designers can use script commands to repeat IP module customization when they receive a new version of an IP module.

The CMVE preserves "generate-if" and "generate-for" constructs present in the RTL and allows a user to edit those structures while still preserving the "generate-if" and "generate-for" structures in the updated RTL. The CMVE creates a virtual hierarchy for each generate-block present in the RTL. The user specifies modifications at an abstract level (e.g., moving logic from one hierarchy to another, grouping/ungrouping logic or swapping an instantiated memory within a generate-for structure with another kind of memory IP). The CMVE takes information from this abstract level and perform all the modifications while maintaining the design configurability in the generated RTL.

The CMVE creates and maintains tagged information about all instances present inside or generated by a for-loop inside a generate-block. The CMVE keeps track of the conditions controlling such instances. The CMVE allows a user to edit the connectivity of those instances and also to update a master for those instances and replace it with a new IP master. For example, users can replace third-party memories present inside a "generate" construct with their own internal memories. A user can edit the "generate" virtual hierarchy in the CMVE schematic editor. A user can also edit the virtual hierarchy using TCL commands. After master replacement and connectivity editing, the CMVE uses the tagged information to regenerate the modified generate structure.

In case of "generate-if" structures, the CMVE reads all possible paths including true and false paths. The CMVE reads one "generate-if" path at a time and tags RTL instances, connections and behavioral logic present in that path accordingly. When the CMVE reads the next path it merges the RTL logic present in that path with that of the previous path RTL logic but tags it differently. The CMVE repeats this process for all the paths. Finally, the CMVE displays a merged views of all "generate-if" paths in its schematic and allows a user to edit instance connections and the master present in each path.

In S280 the CMVE writes the modified database back out as RTL. The CMVE maintains all configuration options. The CMVE writes macro-dependent configuration options using 'ifdef statements and writes out other configuration options such as pragmas, 'define and parameter values. The CMVE preserves the original RTL look and feel as much as possible.

The generation of the RTL to ensure that the look-n-feel is preserved is done in a 2 step process. In the first step, the CMVE reads the RTL with all its configurability and creates a database. While the user performs multiple modifications on this database the CMVE ensures that configurability is maintained in the modified database. The CMVE keeps track of all the changes to the database. This change information is passed to a second stage process which reads the RTL through a text parser and incrementally re-writes the lines where modifications have happened with the new changes. This ensures that the generated RTL has a look-n-feel which is very close to the original RTL and the user can use a difference utility to find out what has changed.

Figure 3:
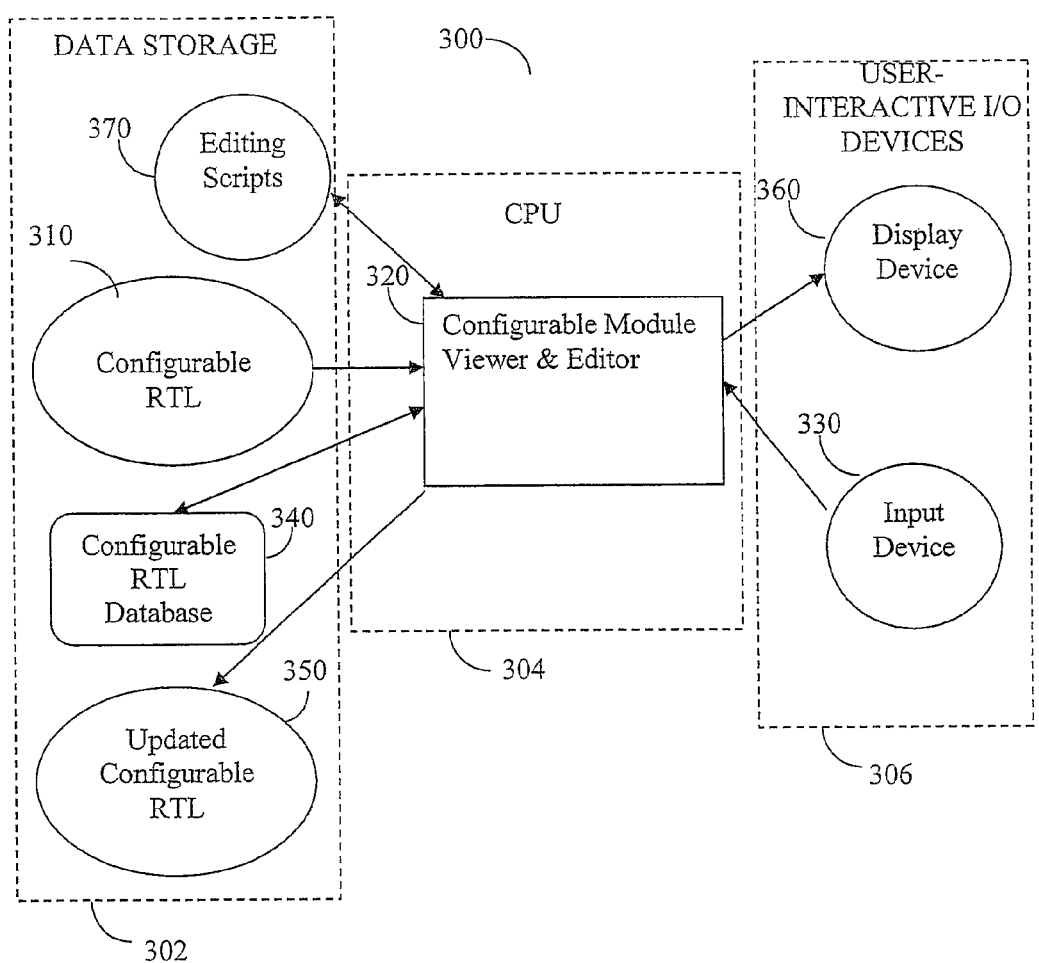
FIG. 3 shows a flowchart block diagram of a configurable module editor and viewer.

FIG. 3 is an exemplary and non-limiting diagram 300 showing a Configurable Module Viewer & Editor (CMVE) 320. A central processing unit (CPU) or microprocessor 304 loads and runs the CMVE software 320. Data storage 302 is accessible to the processor 304 and stores configurable RTL design files 310 representing a circuit description. The Configurable RTL Database 340, editing scripts 370 as well as the updated RTL design files 350 could likewise be stored in the data storage 302. The system 300 further includes user-interactive input/output devices, including at least one input device 330 and display 360.

The CMVE 320 runs as an application program on a central processing unit (CPU) 304. The CMVE 320 interacts with a user through an input device 330 and a display 360. The CMVE 320 displays a visual representation of the configurable module on the display 360. A logic designer specifies CMVE inputs, starts the CMVE, controls viewing and edits the configurable module using the input device 330. The CMVE 320 reads the configurable module RTL 310. The CMVE 320 creates the Configurable RTL Database 340 and reads/updates the Configurable RTL Database 340 when commanded to do so. The CMVE 320 writes the Updated Configurable RTL 350 in response a user's request to save the database edits though input device 330. The CMVE 320 executes editing scripts 370 in response to user's requests through input-device 330. The CMVE 320 may save commands to the editing scripts 370 in response to user requests through input device 330.

The embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

What is claimed is:

1. A method implemented as a configurable module viewer and editor (CMVE) software tool run on a programmed computing system for the viewing and editing of configurable modules of an integrated circuit design, comprising:
  receiving and storing, in a memory accessible to a computer processor, a register-transfer-level (RTL) description of at least a specified portion of an integrated circuit, the received RTL description specifying at least one configurable module of the integrated circuit;
  constructing by the computer processor, and storing in the memory, a database that incorporates for each configurable module all configuration options specified in the RTL description;
  displaying on a computer display a visual representation of a specified portion including at least one configurable module in the integrated circuit such that, based on the stored database, multiple configuration options of the module are viewable simultaneously;
  receiving from a user input one or more changes to the RTL description; and
  automatically propagating, by the processor using the database, of the received changes through the RTL description in a manner that maintains consistency of the configurable module in all configuration options, such that an updated RTL description, with corresponding updates to the database, are stored in the memory.

2. The method as in claim 1, wherein the received RTL description contains, for at least one configurable module, any one or more of: ifdef/undef statements; define statements; parameter definitions; pragmas; generate statements, such as ifgenerate and forgenerate statements; and macro usage.

3. The method as in claim 1, configuration options specified in the RTL description include pre-processor macros that are normally removed by RTL parsers.

4. The method as in claim 1, wherein constructing a database of configuration options comprises extracting the configurability of modules defined in the RTL description by considering all configurability aspects defined by any one or more of 'define, 'ifdef, generate-if, generate-for, and generate-case statements.

5. The method as in claim 4, wherein constructing the database of configuration options also considers configurability aspects across 'include files inside another file.

6. The method as in claim 4, wherein construction a database of configuration options also models configurability on partial constructs in the RTL description.

7. The method as in 1, wherein displaying a visual representation of at least one configurable module simultaneously shows all possible configurations of a module.

8. The method as in claim 1, wherein displaying a visual representation of at least one configurable module presents a simplified view of one or more possible configurations for a module that a user selects to view at the same time.

9. The method as in claim 1, wherein in displaying a visual representation of at least one configurable module presents different ones of the possible configurations in a visually distinctive manner, including one or more of component naming and color.

10. The method as in claim 1, wherein user input on one or more changes to the RTL description is received in the form of graphical commands.

11. The method as in claim 1, wherein user input on one or more changes to the RTL description is received in the form of scripts and stored macros.

12. The method as in claim 11, wherein graphical edits are saved in a script in a manner that allows the processor executing the CMVE tool to automatically apply those edits to a new revision of the configurable module.

13. The method as in claim 1, wherein user input on one or more changes to the RTL description includes design modifications that group, ungroup or move across hierarchies components.

14. The method as in claim 1, wherein user input on one or more changes to the RTL description includes design modifications where one or more master instances are replaced.

15. The method as in claim 1, wherein user input on one or more changes to the RTL description includes design modifications where any RTL statements that will likely generate time-critical paths are replaced with fast library components.

16. The method as in claim 1, wherein automatically propagating changes through the RTL description preserves configurability of modules as logic is moved around or modified by the received user input.

17. The method as in claim 16, wherein configurability on ports, parameters and connections created from moving blocks across hierarchies in the RTL description are automatically propagated by the processor through the RTL description.

18. The method as in claim 1, wherein automatically propagating changes through the RTL description makes minimal modifications such that only impacted and modified areas of the RTL description are changed and such that a difference utility will be able to identify what has been modified by comparison with the received RTL description.

19. A programmed computer system for running a configurable module viewer and editor (CMVE) software tool that provides for viewing and editing of configurable modules of an integrated circuit design, the system comprising:
  a computer memory storing the CMVE software tool, a register-transfer-level (RTL) description of at least a specified portion of an integrated circuit, the RTL description specifying at least one configurable module of the integrated circuit, and a constructed database that incorporates for each configurable module all configuration options specified in the RTL description;
  a computer processor having access to the computer memory and running the software tool;
  a computer display presenting a visual representation of a specified portion including at least one configurable module in the integrated circuit, such that multiple configuration options of the module are viewable simultaneously; and
  an input device for receiving as user input one or more changes to the RTL description;
  wherein the computer processor when running the CMVE software tool constructs the database from a received RTL description, directs the display of the visual representation of the at least one configurable module in multiple configuration options, receives any user input, and automatically propagates, using the database, the received changes through the RTL description in a manner that maintains consistency of the configurable module in all configuration options, such that an updated RTL description, with corresponding updates to the database, are stored in the memory.

\* \* \* \* \*